United States Patent [19]

Ushiyama et al.

[11] Patent Number: 5,420,741
[45] Date of Patent: May 30, 1995

[54] PASSIVE TUNED MAGNETIC FLUX RATE FEEDBACK SENSING AND CONTROL ARRANGEMENT

[75] Inventors: Randall K. Ushiyama, Torrance, Calif.; Michael K. Scruggs, Pompton Plains, N.J.; Eric C. Mathisen, Brooklyn, N.Y.; Eric Hahn, Woodcliff Lake, N.J.

[73] Assignee: Allied-Signal Inc., Morris Township, Morris County, N.J.

[21] Appl. No.: 151,618

[22] Filed: Nov. 15, 1993

[51] Int. Cl.[6] .............................................. G01R 33/00
[52] U.S. Cl. ................................. 361/146; 324/207.12; 324/260
[58] Field of Search ........................ 361/139, 143, 146; 324/207.12, 207.16, 207.17, 207.24, 207.25, 207.26, 225, 233, 239, 258, 259, 260; 310/51; 318/623, 632, 652, 653; 340/568

[56] References Cited

U.S. PATENT DOCUMENTS

| | | | |
|---|---|---|---|
| 3,686,593 | 8/1972 | Zakaria | 333/71 |
| 4,904,921 | 5/1990 | DeVito et al. | 323/264 |
| 5,013,987 | 5/1991 | Wakui | 3185/632 |
| 5,245,879 | 10/1993 | Jackson | 307/116 |
| 5,329,416 | 7/1994 | Ushiyama et al. | 361/146 |

Primary Examiner—Jeffrey A. Gaffin
Attorney, Agent, or Firm—Howard G. Massung

[57] ABSTRACT

An arrangement for obtaining flux rate information in a magnetic: circuit including passive means connected across a flux rate sensor for implementing control of said flux rate. The passive means being a tuned magnetic flux rate feedback sensing and control arrangement wherein impedance is tuned and the energy loss characteristic is adjustable. The selection of inductance and capacitance values provides tuning and the selection of resistance affects the energy loss characteristics.

13 Claims, 3 Drawing Sheets

PASSIVE TUNED MAGNETIC FLUX RATE FEEDBACK SENSING AND CONTROL ARRANGEMENT

BACKGROUND OF THE INVENTION

This invention relates generally to magnetic circuits and particularly to obtaining flux rate of change (flux rate) information in a magnetic circuit such as may be used for vibration attenuation in a magnetic forcer system. More particularly, this invention relates to a passive arrangement for the purposes described and, as such, features passive circuitry to implement closed loop control of flux rate of change.

Many arrangements have been developed for the attenuation of vibrations in, for example, magnetic forcer systems, or other mechanical devices. These arrangements can be either passive or active. A passive arrangement relies on internally supplied power. An active arrangement, on the other hand, requires an external power input. An active broadband arrangement wherein a broad range of vibration frequencies are attenuated is described and claimed in commonly assigned U.S. Pat. No. 5,329,416, and an active tuned arrangement wherein a narrow range of vibration frequencies are attenuated is described and claimed in commonly assigned U.S. Pat. No. 5,399,290, both of which applications were filed by R. Ushiyama on Jun. 30, 1993.

Passive arrangements include spring/mass devices, mechanical dampers and hybrid visco-elastic devices, and are characterized by energy losses, or impedances such that energy transfer does not occur.

For example, spring/mass devices typically have low energy transfer characteristics above the natural frequency (impedance), whereas mechanical dampers have well defined loss characteristics. Hybrid visco-elastic devices have both of these characteristics. The choice of a suitable passive arrangement depends on a variety of factors peculiar to a particular application. However, mechanical dampers are not practical where dissipative losses can lead to thermal problems, and impedance adjustments are typically acceptable only for implementations where vibration disturbance frequencies are limited in range.

The present arrangement features a passive arrangement having a control loop which is tuned for a range of frequencies within which vibrations are attenuated. This arrangement is particularly applicable for implementation where cost is a factor and the degree of attenuation required is moderate. As such, the present arrangement requires only a secondary coil winding and the selection of appropriate inductance, resistance and capacitance values for a tuned circuit.

SUMMARY OF THE INVENTION

This invention contemplates a passive tuned magnetic flux rate feedback sensing and control arrangement wherein impedance is tuned and the energy loss characteristic is adjustable. The selection of inductance and capacitance values provides tuning and the selection of resistance affects the energy loss characteristic. With the arrangement described, tuning can be easily accomplished using discrete resistors, inductors and capacitors and the resulting configuration is compact in size as compared to spring/mass systems which can be rather large for low frequency attenuation, and as compared to damping arrangements having non-linear damping characteristics.

The present arrangement also features "non-contact" operation. That is to say, passive dissipative arrangements typically require relative motion of damping media which could involve orifice flowing, or material shearing characteristics. With the present invention energy is transferred from gap variations through an electromagnetic coupling to a dissipative element such as a resistance and the internal losses of the wiring and the magnetic materials.

Further, the present arrangement tends to attenuate variations in flux due to variations in commanded and/or noise induced currents. This occurs because the effect of the passive arrangement is also seen by the forcer windings due to transformer action.

Accordingly, apparatus according to the present invention features a magnetic circuit including a rotor and a stator separated by a gap, the stator carrying a drive coil and a sensor coil; the stator and the rotor cooperatively arranged so that a signal is induced in the sensor coil and the sensor coil provides a signal proportional to the rate of change of flux in the magnetic circuit; means for providing a command signal; means for providing a signal for energizing the drive coil; means for combining the signal for energizing the drive coil and the command signal for providing a combined signal; means connected to the means for providing the combined signal for applying current compensation to the combined signal and for providing a compensated signal; the means for providing a signal for energizing the drive coil connected to the means for applying current compensation to the combined signal and responsive to the compensated signal therefrom for providing the signal for energizing the drive coil; and passive tuned means connected across the sensor coil for implementing control of flux rate.

A method according to the invention features supporting a drive coil and a sensor coil on a stator; arranging the stator and the rotor in a magnetic circuit and separating said stator and rotor by a gap; providing a command signal; providing a signal for energizing the drive coil whereby the sensor coil provides a signal proportional to the rate of change of flux in the magnetic circuit; combining the energizing signal and the command signal; applying current compensation to the combined signal; providing the energizing signal in response to the current compensated combined signal; and connecting passive tuned means across the sensor coil for implementing control of flux rate.

DETAILED DESCRIPTION OF THE INVENTION

Figure 1:
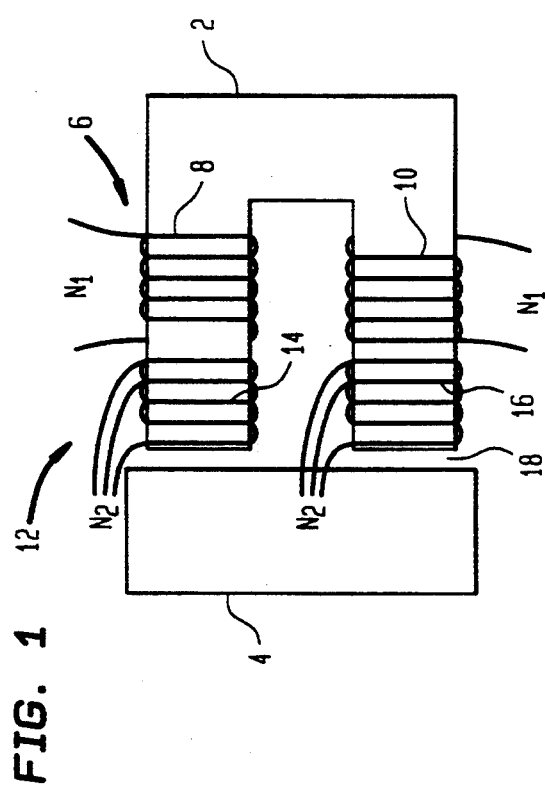
FIG. 1 is a diagrammatic representation illustrating a magnetic circuit contemplated by the invention.

With reference first to FIG. 1, the orientation of a flux rate sensing coil in relation to a drive or forcer coil in a magnetic circuit is illustrated. Thus, a stator is designated by the numeral 2 and a rotor is designated by the numeral 4. Stator 2 carries a drive coil 6 having legs 8 and 10 and carries a sensor coil 12 having legs 14 and 16. Drive coil 6 has $N_1$ number of turns and sensor coil 12 has $N_2$ number of turns. The voltage output of sensor coil 12 at legs 14 and 16 is equal to the number of sensor coil turns ($N_2$) times the rate of change of magnetic flux.

Legs 14 and 16 of sensor coil 12 are disposed close to an air gap 18 between stator 2 and rotor 4. With this arrangement, magnetic flux induced in stator 2 moves from stator 2 to rotor 4 and then back to the stator with minimal pick-up of stray leakage magnetic flux fields in the magnetic circuit.

Figure 2:
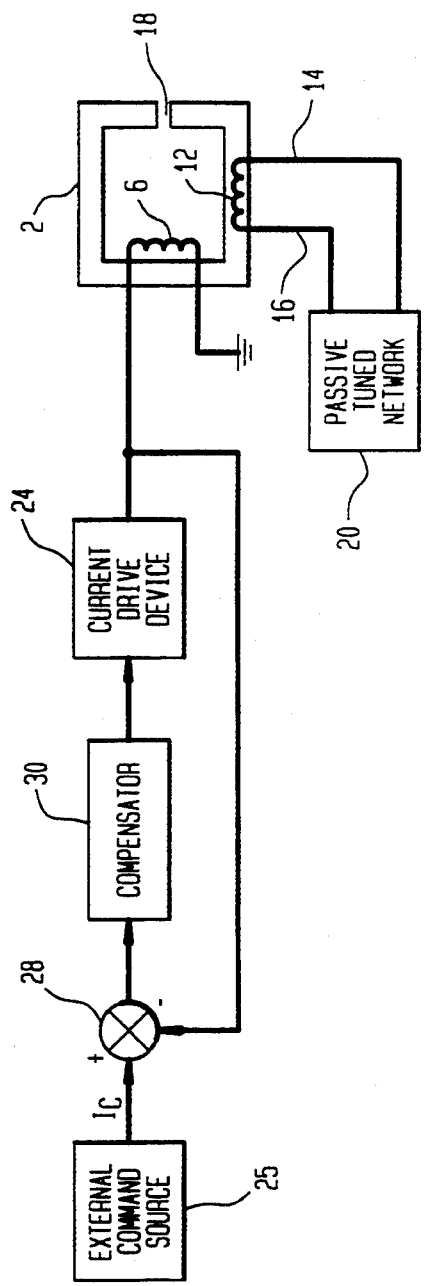
FIG. 2 is a block diagram generally illustrating an arrangement according to the invention and generally showing a passive tuned network.

With reference to FIG. 2, legs 14 and 16 of sensor coil 12 are connected to a passive tuned network 20. Passive tuned network 20 affects the impedance of the arrangement due to variations in gap 18, i.e. runout of rotor 4, as will hereinafter become evident.

An external command source 25 provides a command signal $I_c$ which is applied to a summing device 28 and is summed thereby with the output from a current drive device 24.

Summing device 28 provides a summed signal which is applied to a current forward loop compensator 30 and therefrom to current drive device 24. With the arrangement described the output from current drive device 24 is applied as current feedback to summing device 28 and is applied to drive coil 6 of stator 2 for energizing the drive coil.

Figure 3:
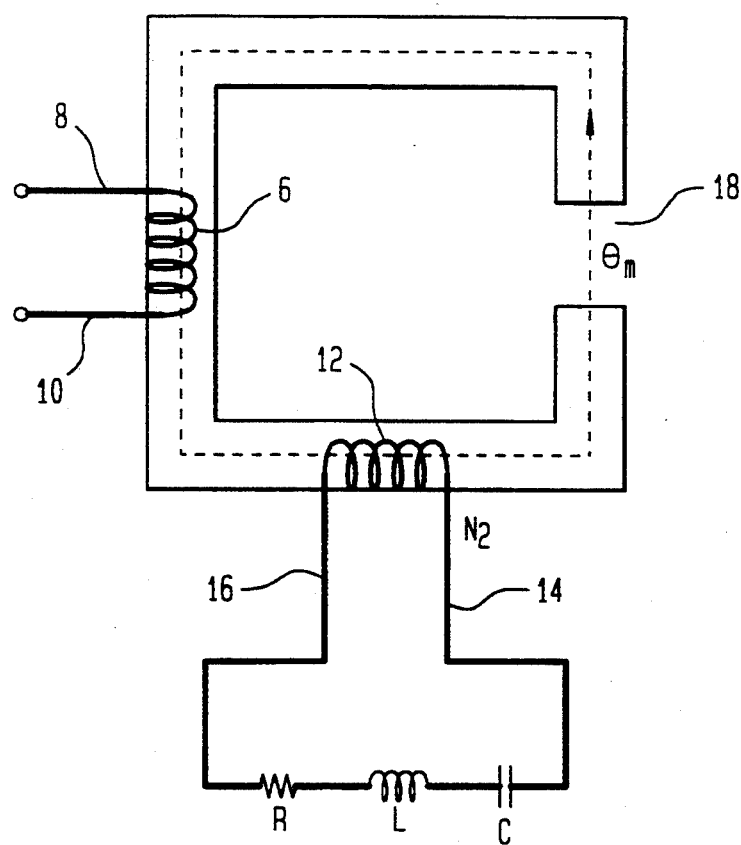
FIG. 3 is a diagrammatic representation more particularly illustrating the passive tuned network shown generally in FIG. 2.

Passive tuned network 20 shown generally in FIG. 1 includes a resistor (R), an inductor (L) and a capacitor (C) serially connected across sensor coil 12 as more particularly shown in FIG. 3.

The heretofore described current feedback loop sets the flux or force level for the forcer arrangement illustrated in FIG. 1. Flux $\Theta_m$ as a function of gap variation is in accordance with the following expression:

$$\theta_m = \frac{K[S^2 + (R/L)S + 1/LC] (1/R_m)}{\left[\frac{(R_m + N_2^2/L)}{R_m}\right] S^2 + (R/L) S + 1/LC} \quad (1)$$

where K is a constant, S is a complex variable resulting from the application of a Laplace Transform, R is resistance, L is inductance, C is capacitance, $R_m$ is the reluctance as a function of gap 18 and $N_2$ is the number of turns of sensor coil 12.

Figure 5:
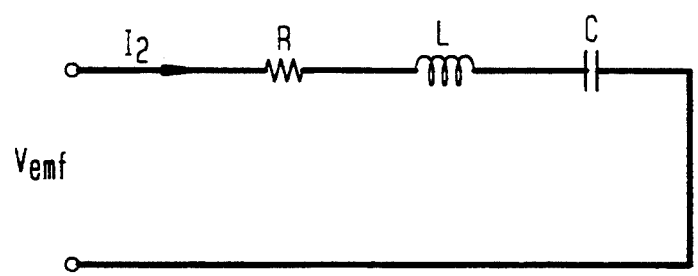
FIG. 5 is a diagrammatic representation of the passive tuned network shown in FIG. 3 and particularly showing relevant parameters.

With reference to the passive network shown in FIG. 5, the current to flux ratio is determined as follows:

$$Z = R + LS + 1/CS; \quad (2)$$

$$I_2 = V_{emf}/Z = V_{emf}/[R + LS + (1/CS)] = \quad (3)$$

$$V_{emf}[CS/(LCS^2 + RCS + 1)];$$

and

-continued $$I_2 = \frac{V_{emf}S/L}{S^2 + (R/L)S + 1/LC}. \quad (4)$$

Since $V_{emf} = N_2 \, d\Theta_m/dt = SN_2\Theta_m$, substitution yields:

$$I_2 = \frac{N_2\theta_m S^2/L}{S^2 + (R/L)S + 1/LC}. \quad (5)$$

Figure 6:
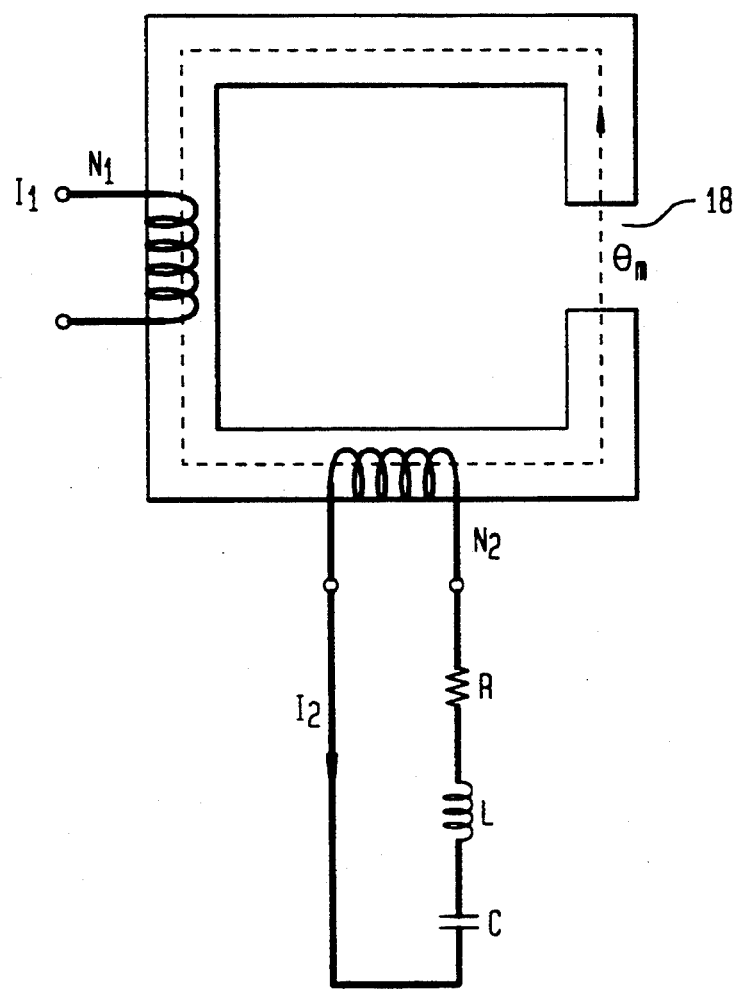
FIG. 6 is a diagrammatic representation of an arrangement according to the invention and particularly showing relevant parameters.

In relation to the configuration shown in FIG. 6:

$$\theta_m = \frac{N_1 I_1 - N_2 I_2}{R_m}. \quad (6)$$

If $I_1$ is controlled by a current loop so as to be a constant (K), substitution of (5) into (6) yields:

$$\theta_m = \frac{K - N_2^2}{R_m}\left[\frac{\theta_m S^2/L}{S^2 + (R/L)S + 1/LC}\right]; \quad (7)$$

$$R_m(\theta_m) = \left[\frac{K - N_2^2 \, \Theta_m S^2/L}{S^2 + (R/L)S + 1/LC}\right]; \quad (8)$$

$$\theta_m \left[\frac{R_m + N_2^2 S^2/L}{S^2 + (R/L) S + 1/LC}\right] = K; \quad (9)$$

$$\theta_m = \frac{K}{R_m + \frac{N_2^2 S^2 L}{S^2 + (R/L)S + 1/LC}}; \quad (10)$$

$$\theta_m = \frac{K(S^2 + R/LS + 1/LC)}{[R_m(s^2 + (R/L)S + 1/LC)] + N_2^2 S^2/L}; \quad (11)$$

and $$\theta_m = \frac{K[S^2 + (R/L)S + 1/LC] (1/R_m)}{\left[\frac{(R_m + N_2^2/L)}{R_m}\right] S^2 + (R/L) S + 1/LC}. \quad (1)$$

Figure 4:
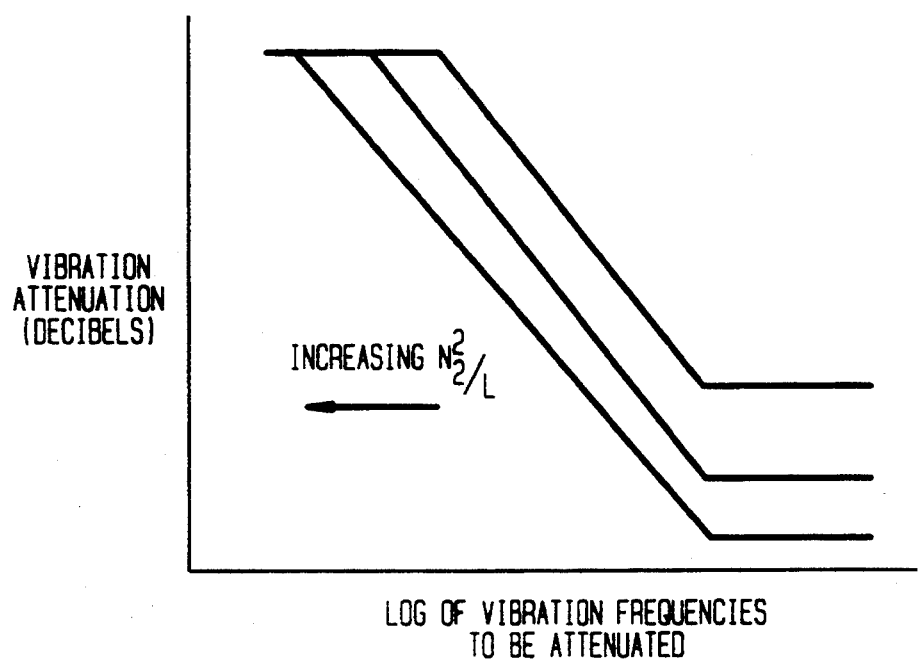
FIG. 4 is a graphical representation illustrating a vibration frequency attenuation profile developed in accordance with the invention.

It is noted that with the careful selection of the discrete components L, C and R, it is possible to derive attenuation curves as shown in FIG. 4, wherein the abscissa of the graphical representation of the Figure represents the log of the vibration frequencies to be attenuated and the ordinate represents vibration attenuation in decibels. The gap variations due to vibration or runout affect the reluctance of the magnetics but the resultant force or flux variations can be attenuated when $N_2^2/L$ is sufficiently large When $N_2^2/L$ is small, flux variations due to gap variations are not attenuated.

With the above description of the invention in mind, reference is made to the claims appended hereto for a definition of the scope of the invention.

What is claimed is:

1. A passive tuned magnetic flux rate feedback sensing and control arrangement, comprising:
   a magnetic circuit including a rotor and a stator separated by a gap, the stator carrying a drive coil and a sensor coil;
   the stator and the rotor cooperatively arranged so that a signal is induced in the sensor coil and the sensor coil provides a signal proportional to the rate of change of flux in the magnetic circuit;

means for providing a command signal;

means for providing a signal for energizing the drive coil;

means for combining the signal for energizing the drive coil and the command signal for providing a combined signal;

means connected to the means for providing the combined signal for applying current compensation to the combined signal and for providing a compensated signal;

the means for providing a signal for energizing the drive coil connected to the means for applying current compensation to the combined signal and responsive to the compensated signal therefrom for providing the signal for energizing the drive coil; and passive tuned means connected across the sensor coil for implementing control of flux rate.

2. An arrangement as described by claim 1, wherein:

the passive tuned means is tuned to a predetermined range of frequencies of the signal provided by the sensor coil whereby signals within said range of frequencies are provided by the sensor.

3. An arrangement as described by claim 1, wherein the passive tuned means includes:

a resistor, an inductor and a capacitor serially connected across the sensor coil.

4. An arrangement as described by claim 3, wherein:

the inductor and the capacitor are selected commensurate with predetermined tuning characteristics; and the resistor is selected commensurate with flux variations due to variations in the gap separating the rotor and the stator.

5. An arrangement as described by claim 2, wherein the passive tuned means includes:

a resistor, an inductor and a capacitor serially connected across the sensor coil.

6. An arrangement as described by claim 5, wherein:

the inductor and the capacitor are selected commensurate with predetermined tuning characteristics; and the resistor is selected commensurate with flux variations due to variations in the gap separating the rotor and the stator.

7. An arrangement as described by claim 4, wherein:

the effect of flux gap variations is attenuated when $N^2_2/L$ is above a predetermined limit, and not attenuated when $N^2_2/L$ is below said predetermined limit, where $N_2$ is the number of turns of the sensor coil and L is the value of the inductor.

8. An arrangement as described by claim 6, wherein:

the effect of flux gap variations is attenuated when $N^2_2/L$ is above a predetermined limit and is not attenuated when $N^2_2/L$ is below said predetermined limit, where $N_2$ is the number of turns of the sensor coil and L is the value of the inductor.

9. A passive tuned method for sensing and controlling flux rate in a magnetic circuit, comprising:

supporting a drive coil and a sensor coil on a stator;

arranging the stator and a rotor in a magnetic circuit and separating said stator and rotor by a gap;

providing a command signal;

providing a signal for energizing the drive coil whereby the sensor coil provides a signal proportional to the rate of change of flux in the magnetic circuit;

combining the energizing signal and the command signal;

applying current compensation to the combined signal;

providing the energizing signal in response to the current compensated combined signal; and connecting passive tuned means across the sensor coil for implementing control of flux rate.

10. A method as described by claim 9, wherein:

connecting passive tuned means across the sensor coil provides tuning to a predetermined range of frequencies of the signal provided by the sensor coil, whereby signals within said range of frequencies are provided by the sensor.

11. A method as described by claim 10 wherein connecting passive tuned means across the sensor coil includes:

serially connecting a resistor, an inductor and a capacitor across the sensor coil.

12. A method as described by claim 11, including:

selecting the inductor and the capacitor commensurate with predetermined tuning characteristics; and selecting the resistor commensurate with flux variations due to variations in the gap separating the rotor and the stator.

13. A method as described by claim 12, including:

attenuating the effect of flux gap variations when $N^2_2/L$ is above a predetermined limit and not attenuating said effect of flux gap variations when $N^2_2/L$ is below said predetermined limit, where $N_2$ is the number of turns of the sensor coil and L is the value of the inductor.

* * * * *